(12) United States Patent
Ando et al.

(10) Patent No.: US 7,407,846 B2
(45) Date of Patent: *Aug. 5, 2008

(54) THIN FILM TRANSISTOR, DISPLAY DEVICE AND THEIR PRODUCTION

(75) Inventors: Masahiko Ando, Hitachinaka (JP); Masatoshi Wakagi, Hitachi (JP); Hiroshi Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/672,908

(22) Filed: Feb. 8, 2007

(65) Prior Publication Data
US 2007/0126003 A1 Jun. 7, 2007

Related U.S. Application Data

(63) Continuation of application No. 10/970,224, filed on Oct. 21, 2004, now Pat. No. 7,202,496, which is a continuation of application No. 10/786,888, filed on Feb. 25, 2004, now Pat. No. 6,828,582.

(30) Foreign Application Priority Data
Sep. 4, 2003 (JP) ............................. 2003-312080

(51) Int. Cl.
*H01L 21/00* (2006.01)
*H01L 21/84* (2006.01)

(52) U.S. Cl. .............. 438/159; 438/164; 257/E21.024; 257/E21.177

(58) Field of Classification Search .............. 438/159, 438/164; 257/E21.024, E21.177
See application file for complete search history.

(56) References Cited

U.S. PATENT DOCUMENTS

| | | | | |
|---|---|---|---|---|
| 6,869,821 | B2* | 3/2005 | Knipp et al. ................. | 438/99 |
| 7,122,828 | B2* | 10/2006 | Bao et al. ..................... | 257/40 |
| 2004/0077122 | A1 | 4/2004 | Wu et al. ..................... | 438/99 |
| 2004/0079940 | A1 | 4/2004 | Redecker et al. ............ | 257/40 |

OTHER PUBLICATIONS

A. Salleo et al., "Plymer Thin-Film Transistor With Chemically Modified Dielectric Interface", Applied Physics Letters, vol. 81, No. 23, pp. 4383-4385, Dec. 2, 2002.

Yen-Yi Lin et al., "Pentacene-Based Organic Thin-Film Transistors", IEEE Transaction on Electron Devices, vol. 44, No. 8, pp. 1325-1331, Aug. 1997.

Henning Sirringhaus et al., Integrated Optoelectronic Devices Based on Conjugated Polymers:, Science vol. 280, Jun. 12, 1998, pp. 1741-1743.

Wakagi Masatoshi et al., "Dependence of Photo-Leakage Current Distribution in TFT on Amorphous-Si Properties", Display and Imaging vol. 7, pp. 129-135, 1998.

* cited by examiner

*Primary Examiner*—Ngan Ngo
(74) *Attorney, Agent, or Firm*—Hogan & Hartson LLP

(57) ABSTRACT

The present method prevents malfunctions in switching caused by a light leakage current in an active matrix type thin film transistor substrate for a liquid crystal display and prevents display failures, by selectively disposing a self assembled monolayer film in a gate electrode-projected region of the surface of an insulator film with high definition, and by selectively improving the orientation order of an organic semiconductor film only in the gate electrode-projected region without improving the order at an irradiated portion with light outside the gate electrode-projected region.

12 Claims, 14 Drawing Sheets

(a)

(b)

(c)

(a)

(b)

(c)

(a)

(b)

(c)

(a)

(b)

THIN FILM TRANSISTOR, DISPLAY DEVICE AND THEIR PRODUCTION

CROSS-REFERENCE TO THE RELATED APPLICATION

This is a continuation of application Ser. No. 10/970,224 filed Oct. 21, 2004, which is a continuation of application Ser. No. 10/786,888 filed Feb. 25, 2004, the entire contents of which are incorporated by reference. This application also claims benefit of priority under 35 U.S.C. § 119 to Japanese Patent Application No. 2003-312080 filed Sep. 4, 2003, the entire contents of which are incorporated by reference.

BACKGROUND OF THE INVENTION

The present invention relates to a thin film transistor with the use of a semiconductor film made of an aggregate of organic semiconductor molecules, and a manufacturing method therefor, particularly the thin film transistor characterized by having a controlled pattern shape of an electrode by improving an orientation order of the organic semiconductor molecules making up a semiconductor film with the use of a selectively disposed self assembled monolayer film, a manufacturing method therefor, and a visual display unit using it.

Recently, an active matrix type display unit using an active device represented by a thin film transistor (TFT) expands its market, while being used for not only a notebook-sized personal computer or a mobile telephone but also a monitor of a workstation or television, by making use of advantages of the excellent picture equivalent to that of a Cathode-Ray Tube (CRT), a low power consumption and a saved space compared to the CRT. However, the active matrix type display unit is more expensive than the CRT, and it is necessary to further lower the price for wider spreading. As one of methods for lowering the price, an application of the organic thin-film transistor (TFT) which can be manufactured by a simple and easy method to the active device, is under examination. A plasma chemical vapor-deposition (CVD) apparatus used for manufacturing an insulation film or a semiconductor film of a current amorphous silicon TFT, and a sputtering apparatus used for manufacturing an electrode, are expensive. The CVD process has a low throughput, because of requiring a high temperature of 250-300° C. for forming the film and a long time for maintenance such as cleaning. A vacuum evaporation apparatus used for manufacturing the organic TFT or a coating device is more inexpensive than the CVD apparatus and the sputtering apparatus, has the low film-forming temperature, and is easy for maintenance. Accordingly, the application of the organic TFT to the active matrix liquid-crystal display may promise a significant cost reduction.

A typical organic TFT is made of a substrate, a gate electrode, an insulation film, a drain electrode, a source electrode, and an organic semiconductor film; and performs a switching operation by modulating an amount of carriers accumulated in an interface between the insulation film and the organic semiconductor film from an accumulation state to a depletion state, with applied voltage to the gate electrode, to change an amount of the current passing between the drain electrode and the source electrode. The organic semiconductor film consists of an aggregate of the organic semiconductor molecules consisting of low-molecules or macromolecules. Known monomeric materials include an acene-based material represented by pentacene or thiophene oligomer, while polymeric materials include poly-3 and hexyl thiophenes (P3HT) which belong to polythiophenes and have a regioregular (having such an array as the whole chain forms a line in a same direction and the head and the tail are connected) structure of a highly regular nanostructure; a copolymer of fluorene-bithiophene (F8T2) as a polyfluorene system; and polyphenylene vinylene (PPV).

In order to obtain a high switching operation by using the organic semiconductor films, the organic semiconductor film formed on the surface of the insulation film needs to have all the organic semiconductor molecules oriented in the same direction and disposed densely.

As a method for forming the organic semiconductor film having the highly oriented order, a method is known in which the surface of the insulation film is previously coated with a self assembled monolayer film (SAM). For instance, as described in Applied Physics Letters 81(23), pp. 4383-4385 (2002) by A. Salleo and others, when the surface of the insulation film comprising a thermally oxidized film of silicon is coated with a SAM such as octadecyl trichlorosilane (OTS), the orientation order of the organic semiconductor film consisting of the F8T2 semiconductor macromolecules is improved, which leads to improvement of the switching performance. In addition, as described in IEEE Trans. Electron. Devices, 44, pp. 1325-1331 (1997), by Y. Y. Lin and others, it is reported that when the surface of the insulation film comprising the thermally oxidized film of silicon is coated with OTS, the orientation order of the organic semiconductor film consisting of the semiconductor low molecules of pentacene deposited by vacuum evaporation is improved, and crystal grain sizes of the organic semiconductor film deposited on the OTS coated thermal oxide film is greater than those deposited on the thermal oxide film without OTS coating, which leads to improvement of the switching performance of the TFT. In addition, as described in SCIENCE Vol. 280, pp. 1741-1743 (1998) by H. Sirringhaus and others, it is known that the electric field-effect mobility of the formed organic semiconductor film is improved to 0.01-0.1 $cm^2/Vs$, when the surface of the insulation film is previously coated with a SAM consisting of hexamethyldisilazane, and then with P3HT thereon.

As described above, it is reported that a method for forming an organic semiconductor film on the surface of an insulation film previously modified with SAM, improves an orientation order of the organic semiconductor film and a switching performance, and provides an organic TFT having a performance equal to or better than that of a current TFT which uses an inorganic semiconductor of amorphous silicon for the semiconductor film.

When the thin film transistor is used in a display device using a backlight, such as a liquid crystal display, a light leakage current caused by photoirradiation from the back side of a substrate should be small to show an adequate switching performance as the thin film transistor. The light leakage current is generated because the semiconductor film absorbs the light applied from the back side of the substrate in a state that a voltage causing the depletion of carriers in the interface between the semiconductor film and the insulation film is applied to the gate electrode, and forms photocarriers which travel due to the voltage applied to drain/source electrodes. It is known that the amount of the leak current is large, when a travelling property of the carriers is high in the semiconductor film formed in the region outside the gate electrode-projected region of the surface of the insulation film, which is not shaded by the gate electrode, and directly absorbs the light applied from the back side of the substrate, particularly in a potential floating region which is not included even in the drain/source electrode region. It is described in detail, for instance, in Display and Imaging Vol. 7, pp. 129-135 (1998) by Wakagi and others.

SUMMARY OF THE INVENTION

As described above, conventional coating with a SAM on the surface of the insulation film to be a substrate has a problem of the increase in the light leakage current, while improving the order of orientations of organic semiconductor molecules in an organic semiconductor film, and a switching performance such as electric field-effect mobility and an on/off ratio of the current. This is because the coating of a SAM has improved the orientation order of the organic semiconductor molecules in the organic semiconductor film not only formed in a gate electrode-projected region on the surface of the insulation film, which controls a switching performance such as an electric field-effect mobility and an on/off ratio of the current, but also formed outside the gate electrode-projected region which controls a light leakage current.

Modification of the surface of the insulation film with a SAM has another problem of an adverse effect on a coating process for the electrode. There has been a problem that a method of forming an electrode by applying an electroconductive ink to the surface of the insulation film and burning it, can not finely form a thin film transistor, because the wettability of the electroconductive ink against the surface of the insulation film affects pattern accuracy of the electrode in the method, a SAM generally having water repellency rejects the electroconductive ink, and makes the pattern accuracy of the electrode low.

As described above, in an organic thin film transistor, the modification of the surface of the insulation film with a self assembled monolayer film, for improving the orientation order of the organic semiconductor molecules and improving the switching performance, has a problem of increasing the light leakage current and being incapable of finely forming the electrode with a coating process.

To solve the above problem, according to the invention, a thin film transistor is provided having a gate electrode, a gate insulation film, a source electrode, a drain electrode, a semiconductor film and a protection film, stacked on a substrate, in which the semiconductor film is composed of an aggregate of organic semiconductor molecules, and the orientation order of the organic semiconductor molecules of the semiconductor film formed in a gate electrode-projected region on the surface of the insulation film is higher than that of the semiconductor film formed outside the region. In particular, a method for forming the organic semiconductor film having the above characteristics is provided which comprises selectively disposing a self assembled monolayer film on the surface of the insulation film and then forming an organic semiconductor film thereon by making use of the property that the orientation order of the organic semiconductor film formed on the self assembled monolayer film is improved. As the above thin film transistor is used a thin film transistor which has a self assembled monolayer film in an interface between a semiconductor film formed on the surface of an insulation film in a gate electrode-projected region and the insulation film, but not in an interface between the semiconductor film formed outside the region and the insulation film. As a self assembled monolayer film is used a water repellent monolayer film which has a carbon chain partly terminated with a fluorine or hydrogen atom.

In addition, a thin film transistor may be used having drain/source electrodes formed by applying and burning an electroconductive ink from a metal, a metallic oxide or an electroconductive polymer in a form of ultra-fine particles, a complex or a polymer capable of forming a liquid material by dispersing into a solvent. Further, a thin film transistor may be used which is formed by stacking a gate electrode, a gate insulation film and a self assembled monolayer film sequentially on a substrate, the self assembled monolayer film being selectively disposed in a gate electrode-projected region, and has a source/drain electrode formed near the both ends of the pattern of the self assembled monolayer film by applying and burning an electroconductive ink including at least one of to ultra-fine metal particles, a metal complex or a electroconductive polymer.

A method is provided for manufacturing a thin film transistor which comprises irradiating a self assembled monolayer film formed on the surface of an insulation film with a light from the surface side of a substrate through a photomask, to remove the self assembled monolayer film from a region outside a gate electrode-projected region in which a semiconductor film is to be formed. In addition, a method may be employed which comprises irradiating a self assembled monolayer film formed on the surface of an insulation film with a light from the back side of a substrate using a gate electrode as a photomask to remove the self assembled monolayer film from a region outside a gate electrode-projected region in which a semiconductor film is formed. Further, a method may be used which comprises pressing a self assembled monolayer film applied on a smooth substrate to the surface of the insulation film to selectively transfer the self assembled monolayer film only onto the gate electrode-projected region by making use of a step between the gate electrode-projected region of the surface of the insulation film and other regions.

An active matrix type thin film transistor substrate is also provided which has several gate electric bus lines, an insulation film, several signal bus lines intersecting with the gate electric bus lines in a matrix form, a protection film, and a pixel electrode, in which the thin film transistors of the present invention are disposed at the intersections of the several gate electric bus lines with the signal bus lines, the gate electric bus line is connected to the gate electrode, the signal bus line is connected to a drain electrode, and the pixel electrode is connected to a source electrode. Further, an active matrix drive display unit is provided using an active matrix type thin film transistor substrate for driving a liquid crystal device or an electrophoretic device.

Other objects, features and advantages of the invention will become apparent from the following description of the embodiments of the invention taken in conjunction with the accompanying drawings.

Figure 1:
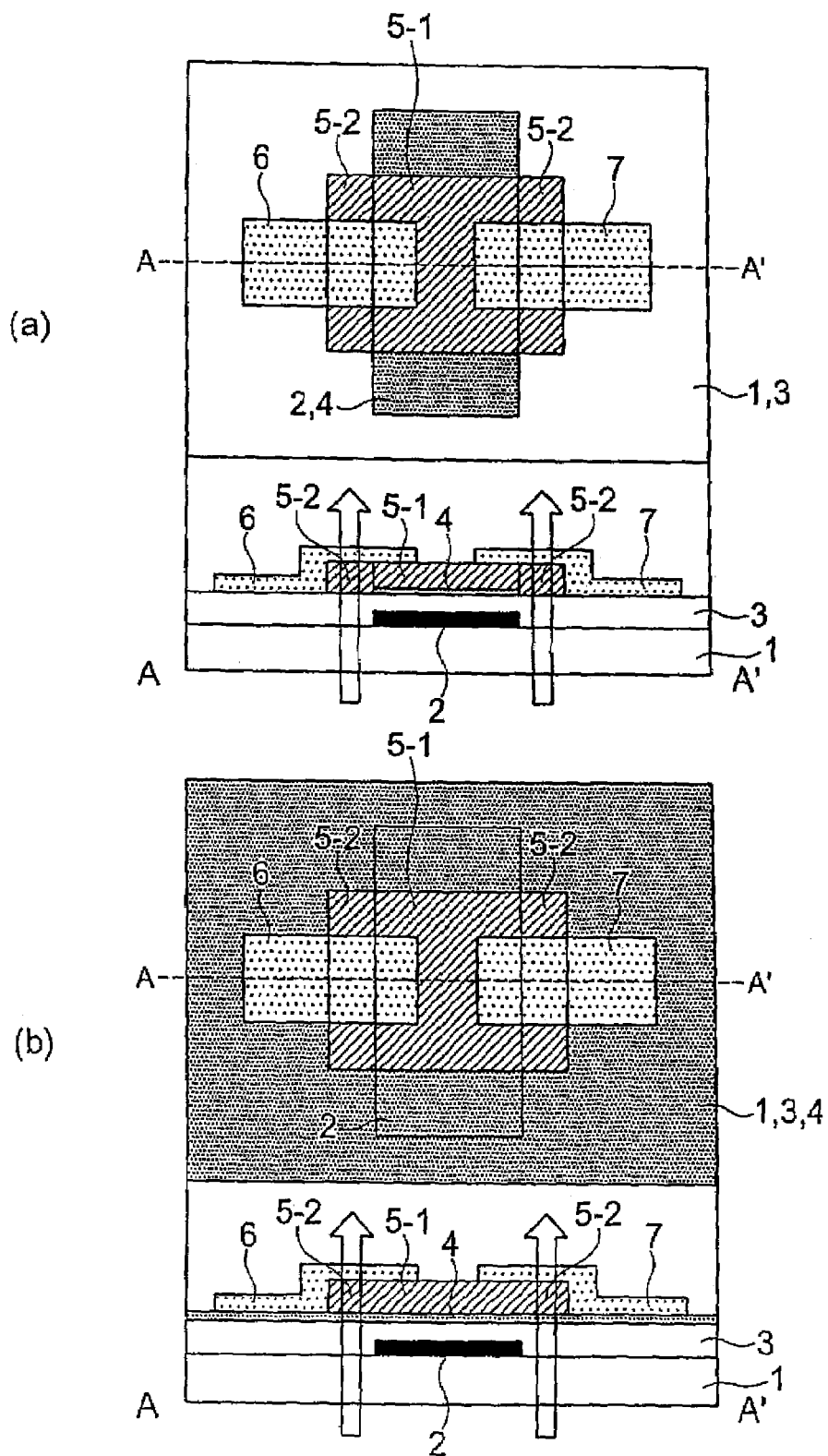
FIG. 1 is a plan view and a sectional view of the thin film transistor which is one of embodiments of the present invention.

The reference numbers have a meaning as follows.

1—substrate, 2—gate electrode, 3—insulation film, 4—self assembled monolayer film (SAM), 5—organic semiconductor film, 5-1—organic semiconductor film section disposed in the gate electrode-projected region, 5-2—organic semiconductor film section disposed outside the gate electrode-projected region, 6—drain electrode, 7—source electrode, 8—protection film, 9—-through hole, 10—pixel electrode, 11—gate scanning electric wiring, 12—signal bus lines, 13—terminal portion of the gate scanning electric wiring, 14—terminal portion of the signal bus lines, 15—active matrix type thin film transistor substrate, 16—gate scanning circuit, 17—signal circuit, 18—control circuit, 19—liquid crystal device, 20—counter electrode, 21—backlight, 22—photoresist, 23—photomask, 24—support substrate, 25—on-state characteristic of the thin film transistors of the present invention and of those with SAM coating on the surface of the insulation film both inside and outside the gate electrode-projected region, 26—off-state characteristic of the thin film transistors of the present invention and of those with SAM coating on the surface of the insulation film both inside and outside the gate electrode-projected region, 27—leakage photocurrent characteristic of the thin film transistor with SAM coating on the surface of the insulation film both inside and outside the gate electrode-projected region, 28—leakage photocurrent characteristics of the thin film transistor of the present invention, 29—on-state characteristics of the thin film transistors of without using SAM, 30—off-state characteristics of the thin film transistors of without using SAM, 31—leakage photocurrent characteristics of the thin film transistors of without using SAM.

The method according to the present invention does not improve the orientation order of all the organic semiconductor film with the use of a self assembled monolayer film, but selectively improves the orientation order of only a portion of the organic semiconductor film in a gate electrode-projected region of the surface of the insulation film, by disposing the self assembled monolayer film only in the above region. Thus, it does not improve the orientation order of a portion of the organic semiconductor film to be irradiated with light, increases an on-state current without increasing a light leakage current, and can improve a switching performance. In addition, the method can form drain/source electrodes disposed self-aligned with a gate electrode with a high definition in a coating process, by making use of a water-repellent action of the self assembled monolayer film selectively arranged with high definition only in the gate electrode-projected region of the surface of the insulation film as described above. Thus, the method allows for manufacturing an organic thin film transistor having a high performance and a high definition in a high productivity with a low manufacturing cost, and applying it to an active matrix type thin film transistor substrate such as a liquid crystal display.

PREFERRED EMBODIMENTS OF THE INVENTION

The embodiments of the present invention will be now described below with reference to the drawings.

Embodiment 1

FIG. 1 is a plan view and a sectional view of the thin film transistor which is an embodiment of the present invention. The figure is a plan view of the thin film transistor and a sectional view (FIG. 1(a)) taken along a straight line A-A' in the plan view, in comparison with the prior art (FIG. 1(b)). On a substrate 1 of Corning 1737 or a quartz, a gate electrode 2 of Cr with a film thickness of 140 nm and an insulation film 3 of a silicon oxide film with a thickness of 400 nm are sequentially stacked. Then, a self assembled monolayer film 4 of octadecyl trichlorosilane (OTS) having an approximately same pattern shape as a gate electrode is disposed in a gate electrode-projected region on the surface of the insulation film and an organic semiconductor film 5 of pentacene which is representative of organic semiconductor molecules of low molecular type, is stacked further thereon. Here, the portion of the organic semiconductor film disposed in the gate electrode region is denoted to be 5-1, and the portion of that disposed outside the above region to be 5-2 to distinguish each other. In this embodiment, a drain electrode 6 of Au with a film thickness of 100 nm and a source electrode 7 are disposed on the above organic semiconductor film 5, so as to be partly overlapped with the gate electrode 2, thus completing a thin film transistor. A difference between the thin film transistor of the present invention (FIG. 1(a)) and the conventional thin film transistor (FIG. 1(b)) lies in the location of the self assembled monolayer film 4 on the surface of the insulation film. The location in the present invention is limited to the gate electrode-projected region, while the location in the conventional example shown in the figure covers the whole region of the surface of the insulation film. As a result, in the present invention, the organic semiconductor film is formed on the self assembled monolayer film 4, only in the portion 5-1 disposed in the gate electrode-projected region, while the organic semiconductor film is directly formed on the surface of the insulation film having no self assembled monolayer film 4, in the portion 5-2 disposed outside the gate electrode-projected region. In contrast, in the conventional example, all organic semiconductor films 5 are formed on the self assembled monolayer film 4.

Figure 2:
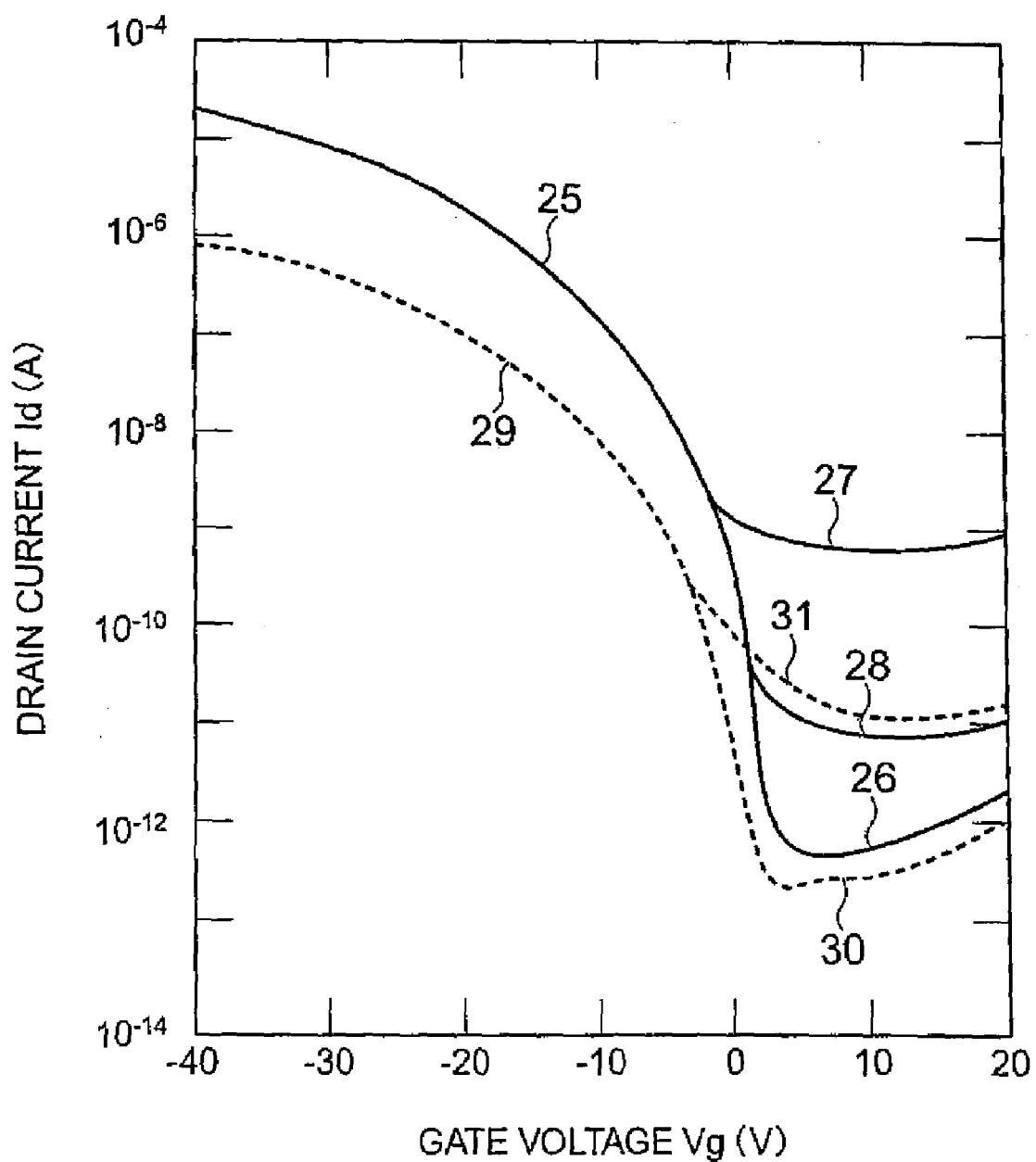
FIG. 2 shows current-voltage (Id-vg) characteristics of the thin film transistor of the present invention.

FIG. 2 shows a dependency of a drain current (Id) on a gate voltage (Vg) (Id-Vg characteristic) in a dark state and a light state of the thin film transistor of the present invention. Here, a backlight of a liquid crystal from fluorescent tubes with an illumination of 3,000 lux is applied from the back side of a substrate, in the light state. The Id-Vg characteristics of the present invention and the prior art in the dark state are respectively shown by lines 25 and 26 and there is no difference between both lines. The line 25 shows the characteristic of the on-state current generated by positive hole charges which accumulate in the interface between the organic semiconductor film 5-1 in a gate electrode-projected region and an insulation film 3, caused by a negative gate voltage, while the line 26 shows the characteristic of the off-state current generated by depletion of the hole charges in the interface caused by appositive gate voltage. Lines 27 and 28 show the characteristics of the off-current in the light state, namely, characteristics of a light leakage current, of a thin film transistor according to the prior art and the present invention respectively. The current increases by about three orders of magnitude in comparison with the dark state in the prior art, while it increases by merely one order of magnitude in the present invention. The light leakage current decreases by about two orders of magnitude in the present invention, which shows an obvious effectiveness of the present invention. Lines 29, 30 and 31 shown in the figure respectively indicate the on-state current, the off-state current and the light leakage current in the thin film transistor, in which the organic semiconductor film is directly formed on the surface of the insulation film with no self assembled monolayer film 4 thereon. From comparison of these lines, it is understood that it is effective to dispose a self assembled monolayer film 4 in the gate electrode-projected region of the surface of the insulation film, in order to increase the on-state current (the on-state current 25), and not to dispose the self assembled monolayer film 4 outside the gate electrode-projected region, in order to decrease the light leakage current (the light leakage current characteristics 28 and 31). The orientation order of an organic semiconductor film 5 made of an aggregate of pentacene molecules has been confirmed with the following method. At first, as a result of measuring a surface shape of an organic semiconductor film 5 with an atomic force microscope (an AFM), it was found that grain sizes in the organic semiconductor film 5 are about 2-3 μm in the portion 5-1 formed on a self assembled monolayer film 4, which are larger than those of about 0.5 μm in the portion 5-2 directly formed on the surface of the insulation film having no self assembled monolayer film 4. It was found that organic molecules are regularly oriented in the crystal grains, and the portion 5-1 having larger grains than those in the portion 5-2, has a higher orientation order. In addition, as a result of a measurement with X-ray diffraction, a high peak of a so-called thin-film crystal phase appears in the portion 5-1, whereas the crystalline peak is low even if it appears in the portion 5-2, and the crystalline peak does not appear in an amorphous film with a further low orientation order. From the above results, it is understood that the portion 5-1 of the organic semiconductor film having the self assembled monolayer film 4 in the gate electrode-projected region has a higher orientation order than the portion 5-2 of the organic semiconductor film having no self assembled monolayer film 4 outside the gate electrode-projected region.

When polymeric materials such as P3HT and F8T2 are used for an organic semiconductor film 5, an orientation order can be confirmed with the following method. In the case of polymeric materials as well, when the orientation order is high, a micro-crystalline phase with grain sizes of about 10 nm is formed in the film, which can be measured with X-ray diffraction. In addition, the size of the micro-crystalline phase in which the semiconductor macromolecules are orderly orientated, can be actually measured by observing a shape of the surface of the organic semiconductor film 5 with a scanning tunneling microscope. A peak of oscillation absorption due to a π-π orbital interaction between the molecules increases when the molecules are more orderly orientated and more densely aggregated. As a result of a measurement for the absorption peak of the π-π orbital interaction by an optical absorption spectra measurement on portions 5-1 and 5-2 of the organic semiconductor film, the former showed a higher peak intensity The difference of the orientation order in the organic semiconductor film 5 can be thus confirmed in a polymeric semiconductor material as well.

It can be confirmed with the following method that a self assembled monolayer film (SAM) 4 is located under an organic semiconductor film 5-1 in a gate electrode-projected region, and is not under an organic semiconductor film 5-2 outside the gate electrode-projected region. The organic semiconductor film 5 is removed from a device immersed in a solvent, and the shape of the surface of an insulation film 3 is observed with an STM or an AFM at a low temperature of liquid nitrogen (77 K) or lower. Then, the shape of rod-like molecules making up the SAM or the aggregate of them is directly observed in the gate electrode-projected region provided with the SAM, whereas such a shape is not observed in the region which is outside the gate electrode-projected region and not provided with the SAM. When the SAM is made up of molecules having a carbon chain at least a portion of which is terminated with a fluorine atom, the presence or absence of elemental fluorine can be confirmed in both regions by using a high-resolution photoelectron spectroscopy.

Figure 3:
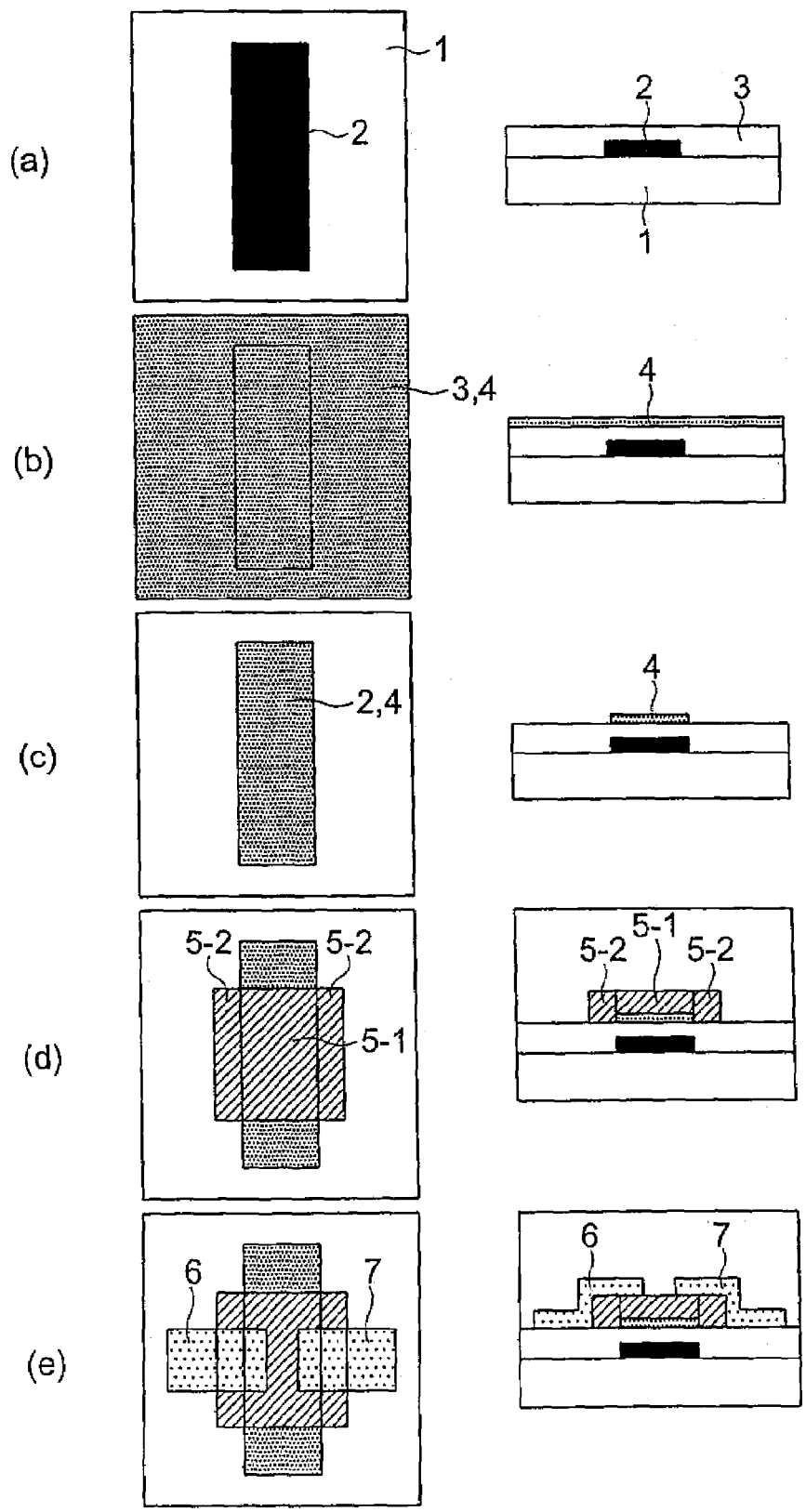
FIG. 3 is a plan view and a sectional view showing a process for manufacturing the thin film transistor of the present invention.

FIG. 3 is a plan view and a sectional view which show a process for manufacturing the thin film transistor of the present invention. First, a Cr thin film with a film thickness of 140 nm has been deposited on a glass substrate 1 of Corning 1737, a synthetic quartz or the like at a substrate temperature of 200° C. by using a DC magnetron sputtering apparatus, and then processed with photolithography by using a cerium(IV) ammonium nitrate solution as an etchant to form a gate electrode 2. Then a silicon oxide film with a film thickness of 400 nm has been deposited on an insulation film 3 at a substrate temperature of 350° C. with a plasma chemical vapor deposition (a plasma CVD) using tetraethoxysilane (TEOS) and oxygen ($O_2$) as source gases (FIG. 2(*a*)). A self assembled monolayer film 4 is formed by densely depositing octadecyl trichlorosilane (OTS) on the surface of an insulation film, by immersing the insulation film for 30 minutes in the GTS solution of 5 to 10 millimole % using hexadecane or heptane as a solvent. The self assembled monolayer film 4 is formed in approximately the same pattern shape as the gate electrode 2. There are several methods for forming it, which will be described later. Molecules of pentacene have been deposited on the substrate at a room temperature to 100° C. with vacuum evaporation, and then have been processed into an island shape of an organic semiconductor film 5, with photolithography through using vapor deposition with a mask or oxygen as an etching gas. In the above case, the organic semiconductor film 5 made of the low molecules of pentacene, has been formed with vacuum evaporation, but a soluble precursor or derivative of pentacene can be employed. In this case, the organic semiconductor film 5 can be formed with a coating process such as casting, spin coating, or dip coating using toluene, chloroform or the like as a solvent as in the case where semiconductor polymeric materials such as P3HT or F8T2 are coated.

A drain electrode 6 and a source electrode 7 of Au with a film thickness of 100 nm are formed thereon by vapor deposition using a mask, and thus a thin film transistor is completed.

Figure 4:
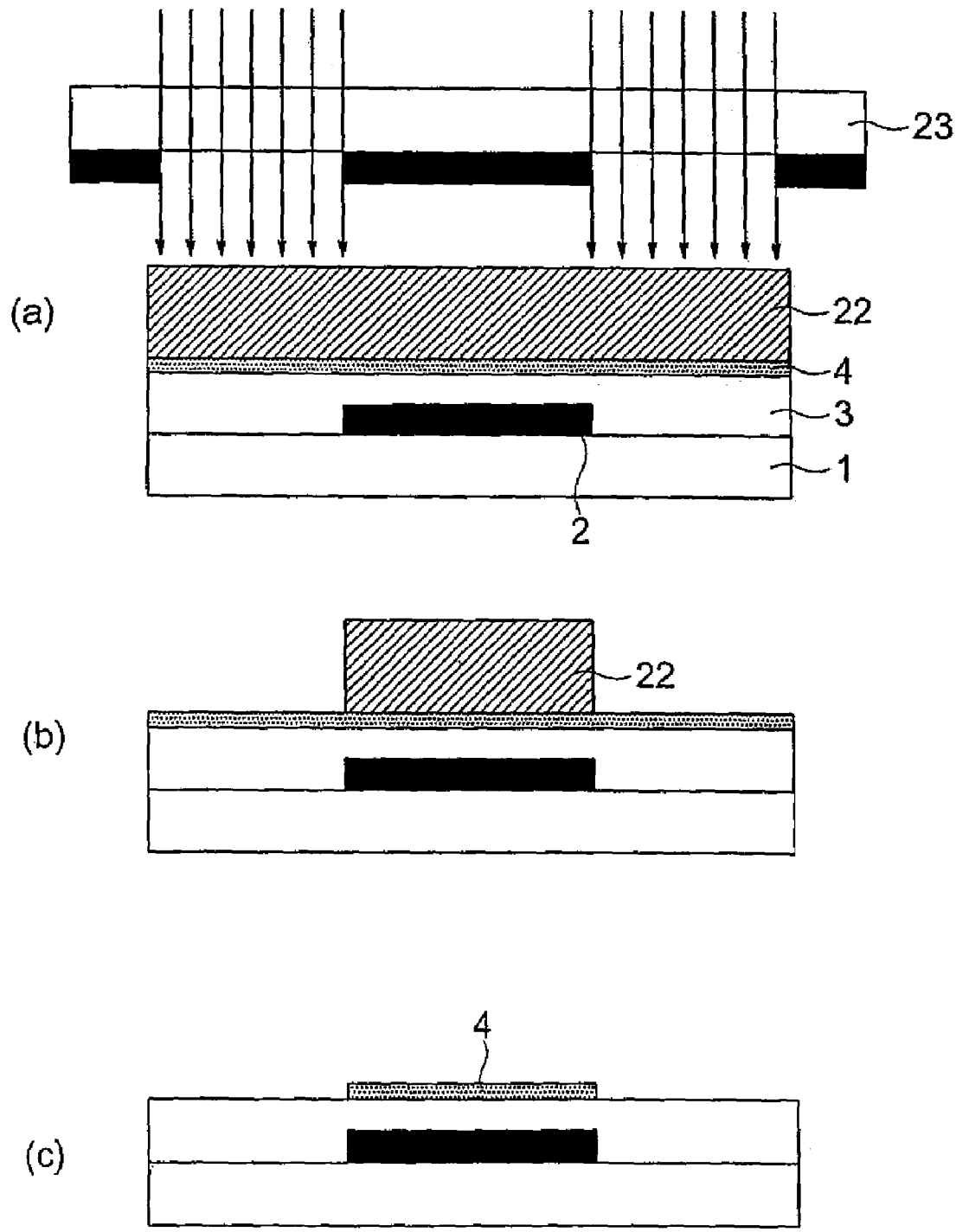
FIG. 4 shows a process for selectively forming a self assembled monolayer film (SAM), which is the first embodiment of the present invention.

Several methods for selectively forming a self assembled monolayer film (SAM) 4 in a gate electrode-projected region on the surface of an insulation film 3, to manufacture the thin film transistor of the present invention, are shown in FIG. 4 to FIG. 8. FIG. 4 shows a most general process with the use of photolithography. A positive photoresist 22 is applied onto a substrate 1 on which a gate electrode 2, an insulation film 3 and a SAM 4 are stacked, and is exposed to an ultraviolet radiation irradiated through a photomask 23 aligned well with a substrate (FIG. 4(a)). In this step, a photomask of a quartz substrate is used, on the surface of which a pattern of a film of a metal such as Cr is formed so as to shade a gate electrode-projected region and illuminate a portion outside the gate electrode-projected region, in which an organic semiconductor film is formed. An exposed photoresist is developed and burnt to form a pattern such that the photoresist is disposed in the gate electrode-projected region, but not in the organic semiconductor film-formed region outside the gate electrode-projected region (FIG. 4(b)). A substrate having the self assembled monolayer film 4 selectively formed in the gate region of the surface of the insulation film 3 with the use of a negative resist 26. Subsequently the SAM 4 is formed thereon and the photoresist 22 is removed. Then, the SAM 4 formed on the surface of the photoresist is removed together (lift off) and the SAM 4 is selectively formed in the gate electrode-projected region.

Figure 7:
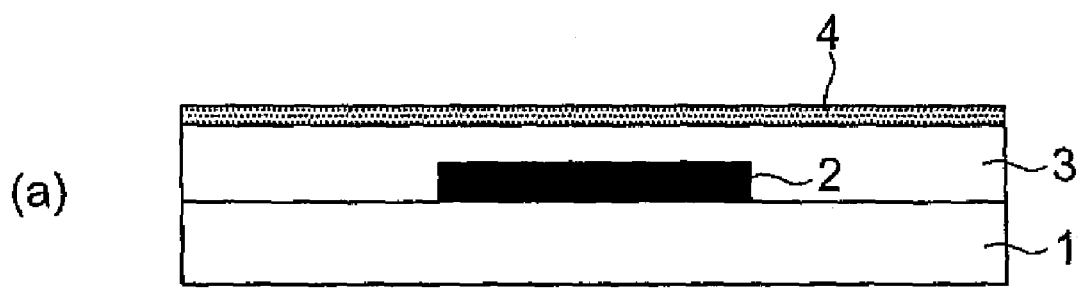
FIG. 7 shows a process for selectively forming a self assembled monolayer film (SAM), which is the fourth embodiment of the present invention.
Figure 7:
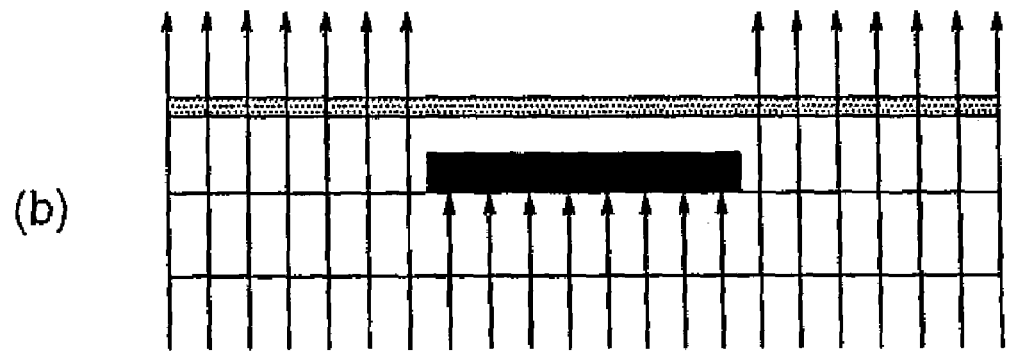
Figure 7:
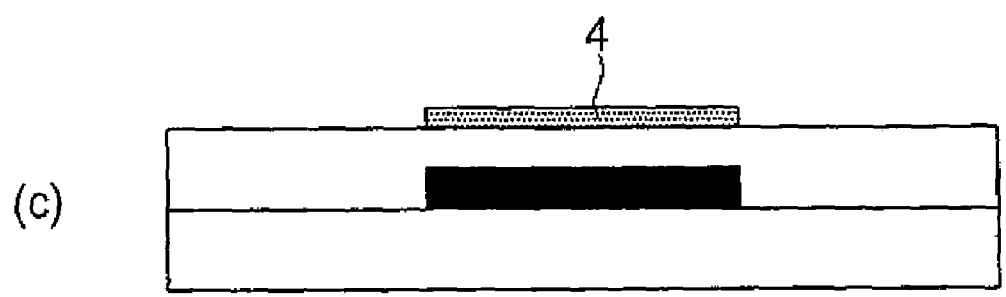

FIG. 7 shows a process for selectively forming a SAM with a direct back side exposure process. In this process, a photo-decomposable material is employed as a material of the SAM 4 which is decomposed and removed by a light with a wavelength transmitting a substrate 1 and an insulation film 3, and the SAM 4 is directly formed in the approximately same pattern shape as a gate electrode 2, with exposure from the back side. Particular examples of these materials include photosensitive water repellent films made of a molecule having a dye structure that thermally decomposes by absorbing a light with a wavelength of 300 nm to 700 nm, which specifically includes the following compound 1 and 2.

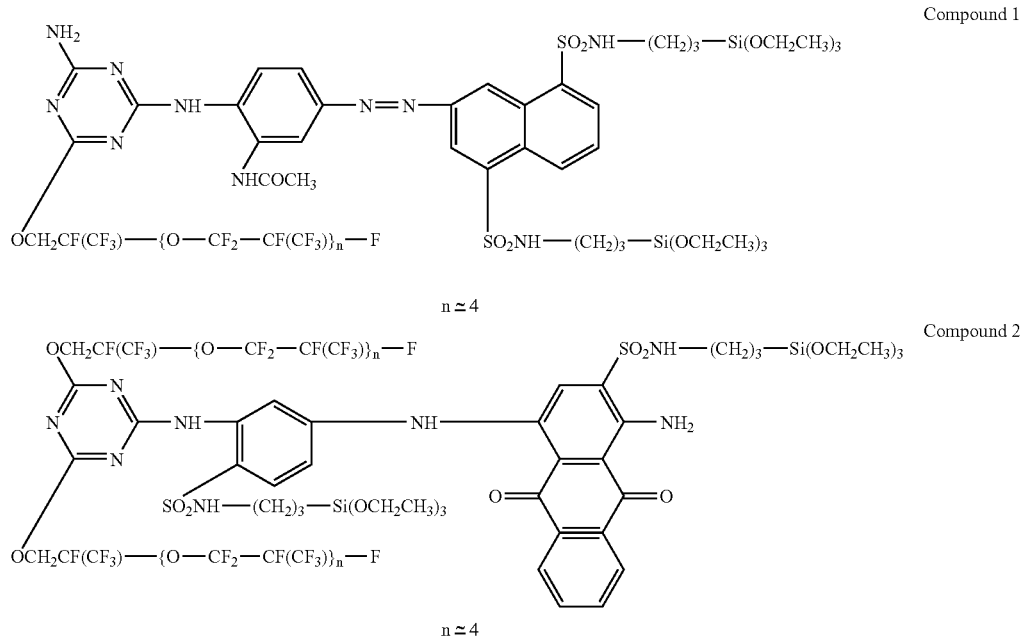

electrode-projected region of the surface of the insulation film 3 is provided by etching the SAM 4 and removing it with oxygen plasma treatment using the pattern of the photoresist as a mask, and then removing the photoresist.

Figure 5:
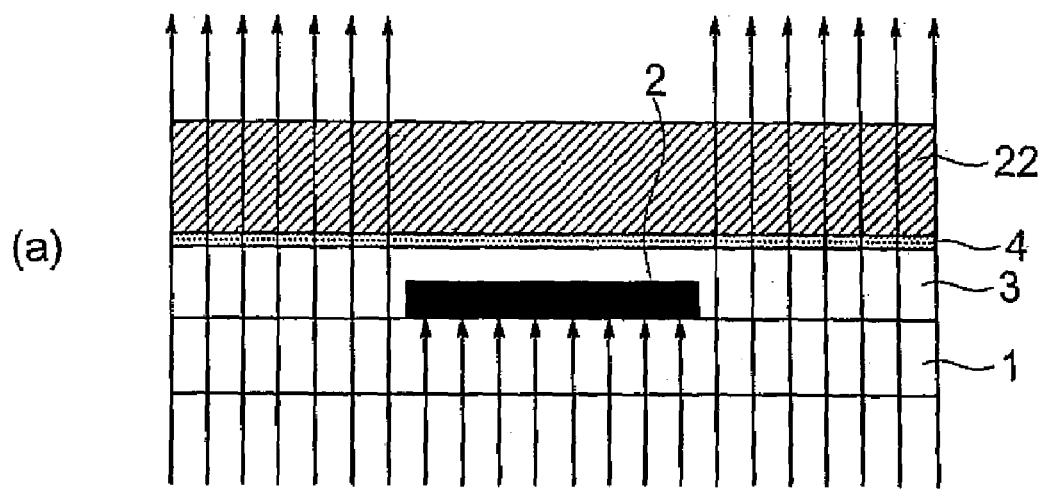
FIG. 5 shows a process for selectively forming a self assembled monolayer film (SAM), which is the second embodiment of the present invention.
Figure 5:
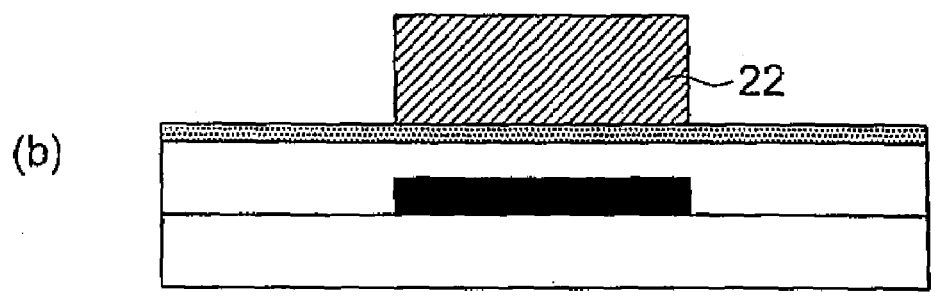
Figure 5:
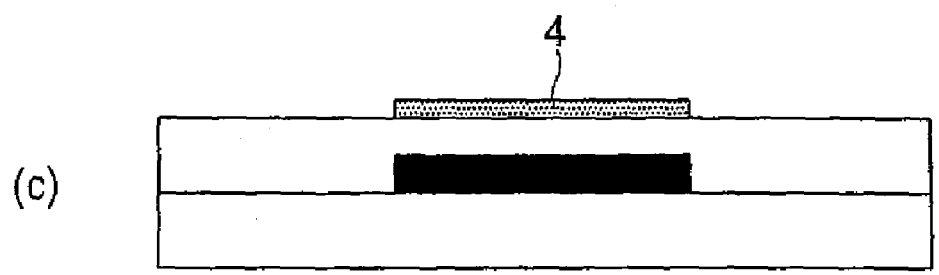

FIG. 5 shows a process for selectively forming a SAM with the use of a back side exposing process. In this process, a photoresist is exposed from the back side of the substrate (FIG. 5(a)) prepared in the same way as in FIG. 4, by using a gate electrode 2 as a photomask. A substrate having the SAM 4 selectively formed on a gate electrode-projected region of the surface of an insulation film 3 is provided by etching the SAM 4 and removing it using a photoresist 22 formed so as to have an approximately same pattern as a gate electrode as a mask, and then removing the photoresist.

Figure 6:
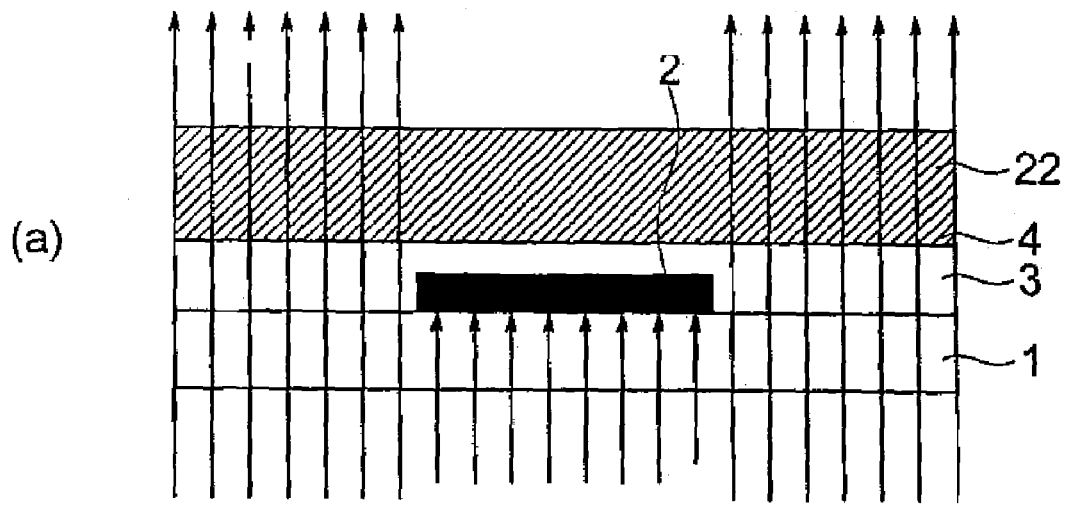
FIG. 6 shows a process for selectively forming a self assembled monolayer film (SAM), which is the third embodiment of the present invention.
Figure 6:
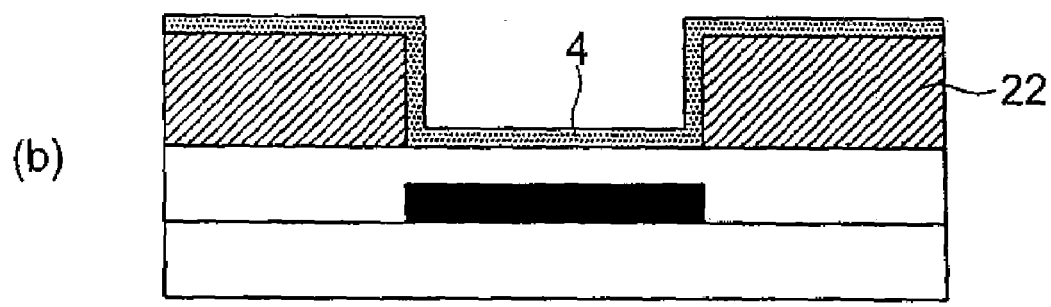
Figure 6:
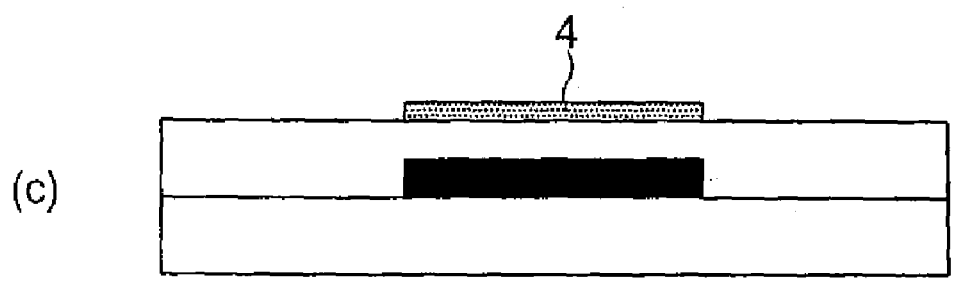

FIG. 6 shows a process for selectively forming a SAM with a lift-off process. In this process, first, a photoresist 22 is formed in a gate electrode-projected region of the surface of an insulation film 3, and then the SAM 4 is formed thereon (FIG. 6(a) to (b)). The figure shows an example of forming the photoresist 22 with a back side exposure process, in which the photoresist 22 is formed outside the gate electrode-projected A method for synthesizing the compounds will now be described below.

(Synthesis of the Compound 1)

The compound 1 is synthesized by the following reactions (i) to (iii).

(i) Reduction of a Water Repellent Material

Krytox 157FS-L (with a mean molecular weight of 2,500) (50 pts. wt.) made by DuPont is dissolved in PF-5080 (100 pts. wt.) made by Minnesota Mining & Manufacturing Co., lithium aluminum hydride (2 pts. wt.) is added to the above, and the liquid is heated at 80° C. for 48 hours while being stirred. The reacted liquid is poured into iced water, and the lower layer is separated, is washed with hydrochloric acid of 1%, and is washed with water until a cleaning fluid becomes neutral. The liquid is subsequently filtered through a filter paper, to remove water in the cleaned liquid, PF-5080 is distilled off with an evaporator, and a compound 3 (45 pts. wt.) is obtained in which the end of Krytox 157FS-L is converted into $CH_2OH$.

$F—\{CF(CF_3)—CF_2O\}_n—CF(CF_3)—CH_2OH$  n≅4     Compound 3

(ii) Introduction Reaction of a Dye Structure

The compound 3 (45 pts. wt.) is dissolved in HFE-7200 (100 pts. wt.) made by Minnesota Mining & Manufacturing Co., then Reactive yellow 3 (alias Procion yellow HA) (12 pts. wt.), ethanol (100 pts. wt.), and sodium carbonate (2 pts. wt.) are added to the liquid, and the liquid is refluxed for 30 hours. The structure of Reactive yellow 3 is shown below.

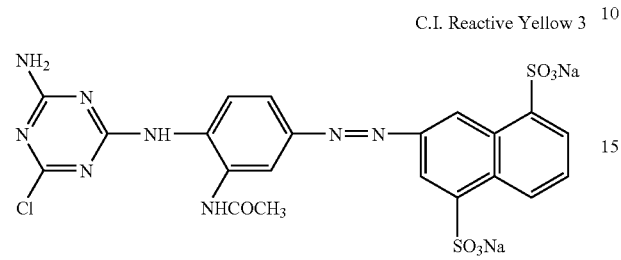

C.I. Reactive Yellow 3

Subsequently, the solvent (HFE-7200 and ethanol) in the reacted liquid is distilled off with an evaporator, a liquid consisting of HFE-7200 (100 pts. wt.), hydrochloric acid of 35 wt. % (100 pts. wt.) and iced water (100 pts. wt.) is added to the residue, and the liquid is vigorously stirred and then left at rest. The lower layer is separated, and is washed with water until a cleaning fluid becomes neutral. The liquid is subsequently filtered through a filter paper, to remove water in the cleaned liquid, HFE-7200 is distilled off with an evaporator, and a compound 4 (45 pts. wt.) is obtained in which a compound 28 is coupled with the reactive yellow 3.

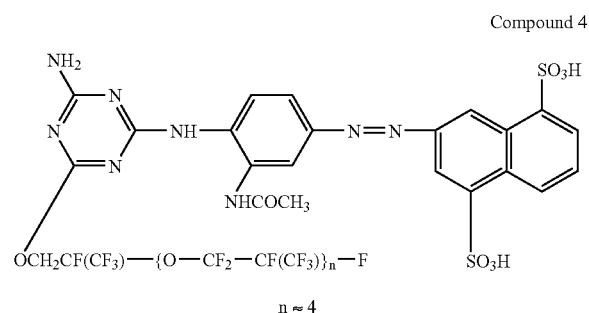

Compound 4 n ≈ 4

(iii) Introduction Reaction of a Binding Site

The compound 4 (45 pts. wt.) is dissolved in HFE-7200 (100 pts. wt.), Sila-Ace S330 (10 pts. wt.) made by Chisso Corporation, N,N-dicyclohexyl carbodiimide (10 pts. wt.) and dichloromethane (20 pts. wt.) are added to the liquid while cooling the liquid to about 0° C., and the liquid is stirred for 3 hours. The reacted liquid is again returned to atmospheric temperature, and is stirred for 30 hours. The reacted liquid is left at rest, and when the reacted liquid substantially separates into two layers, the lower layer is separated. In addition, cloud results between the upper layer and the lower layer, but this is not added to the lower layer. The lower layer is washed with dichloromethane (20 pts. wt.) several times, and the liquid is filtered with a filter paper. Then, the solvent (HFE-7200) in the liquid is distilled off with an evaporator, and the desired compound 1 (40 pts. wt.) is obtained.

(Synthesis of a Compound 2)

A similar process is used as in the synthesis of the compound 1 except for using Mikacion brilliant blue RS (7 part by weight) instead of Reactive yellow 3 (12 part by weight) to obtain compound 2 (40 part by weight).

The structure of Mikacion brilliant blue RS is shown below.

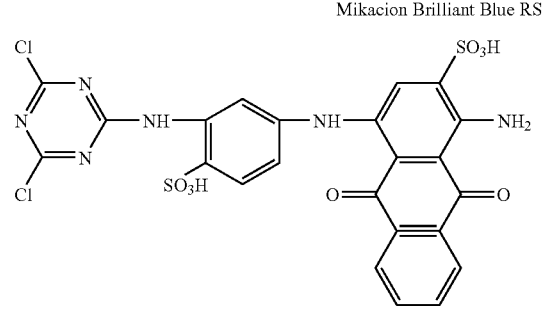

Mikacion Brilliant Blue RS

In some cases, a part of sodium sulphonate may be sulfonic acid. Then, the part is converted into sodium sulphonate with sodium hydroxide or the like, and the compound is used.

When the above compound 1 or 2 is used for a photosensitive water-repellent film, a substrate 1 and an insulation film 3 have only to transmit any wavelength in the range of 300 to 700 nm. Accordingly, a thin film formed with a plasma chemical vapor deposition or a sol-gel process can be used as the insulation film 3 which has a thickness of 300 nm made of an inorganic material such as tantalum oxide ($Ta_2O_5$), zirconium oxide ($ZrO_2$) or lanthanum oxide ($La_2O_3$) as well as silicon oxide ($SiO_2$). As an organic material, a spin-coated film of polyvinyl phenol (PVP) or polymethylmethacrylate (PMMA) may be used. As the substrate 1, common glass substrates such as Corning 1737 and various plastic substrates can be employed.

Figure 8:
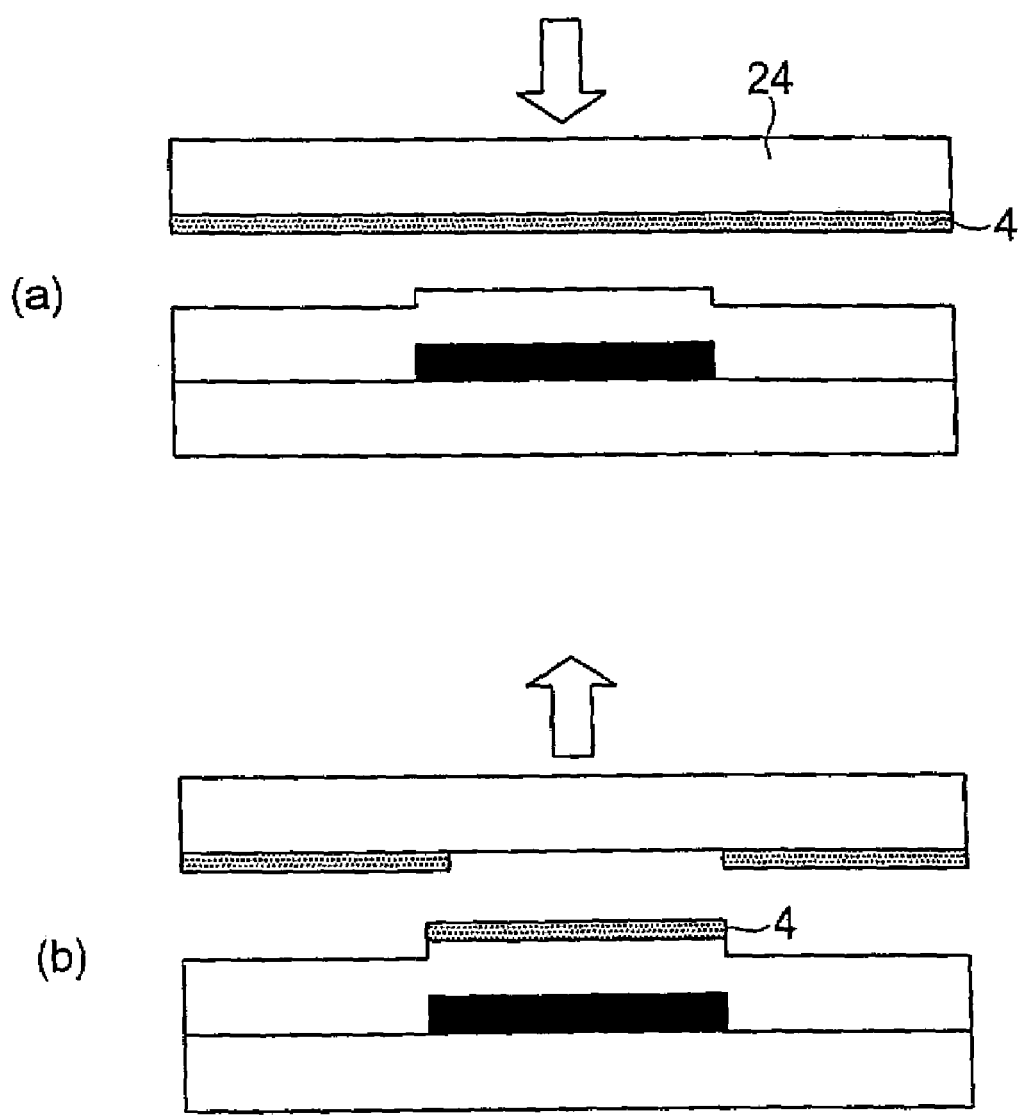
FIG. 8 shows a process for selectively forming a self assembled monolayer film (SAM) which is the fifth embodiment of the present invention.

FIG. 8 shows a process for selectively forming a SAM with a microcontact printing process. The process makes use of such a topography that a gate electrode-projected region is higher than other regions by just the thickness of a gate electrode 2, and the surface of an insulator film 3 has a shape like a relief printing plate. A smooth support substrate 24 made of Al or the like, on the surface of which a SAM 4 is coated, is adhered to a substrate 1 having layers containing an insulation film 3 stacked, and is heated at 120° C. for about 10 minutes (FIG. 8(a)). In this step, the SAM is selectively contacted with a salient formed only in a gate electrode-projected region on the surface of the insulation film 3. When the smooth support substrate 24 is slowly detached, the SAM is selectively bonded to and formed on only the gate electrode-projected region.

The processes particularly shown in FIG. 4 and FIG. 8 among the processes in FIG. 4 to FIG. 8 do not require the substrate and the insulation film to be transparent. Accordingly, when these processes are employed, metallic substrates coated with the insulation film thereon can be employed.

Embodiment 2

Figure 9:
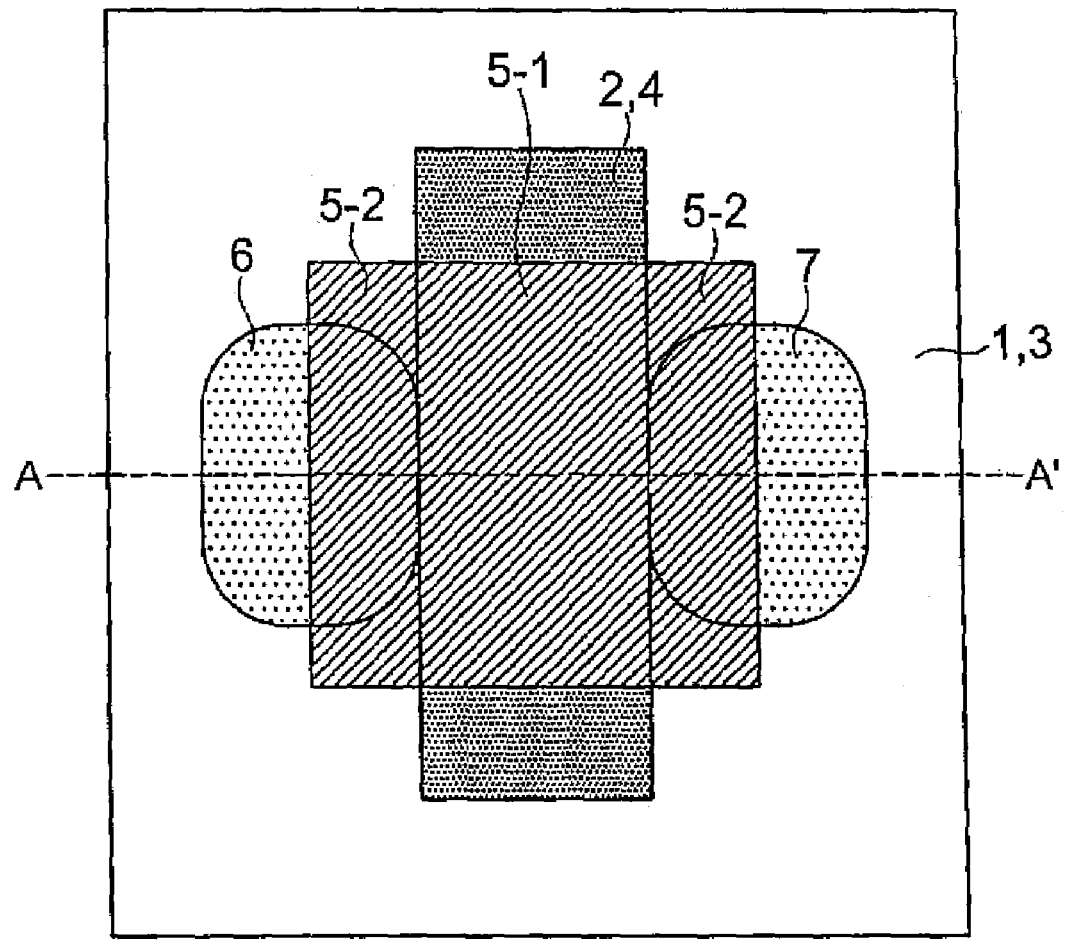
FIG. 9 is a plan view and a sectional view of a thin film transistor, which show an embodiment 2 of the present invention.
Figure 9:
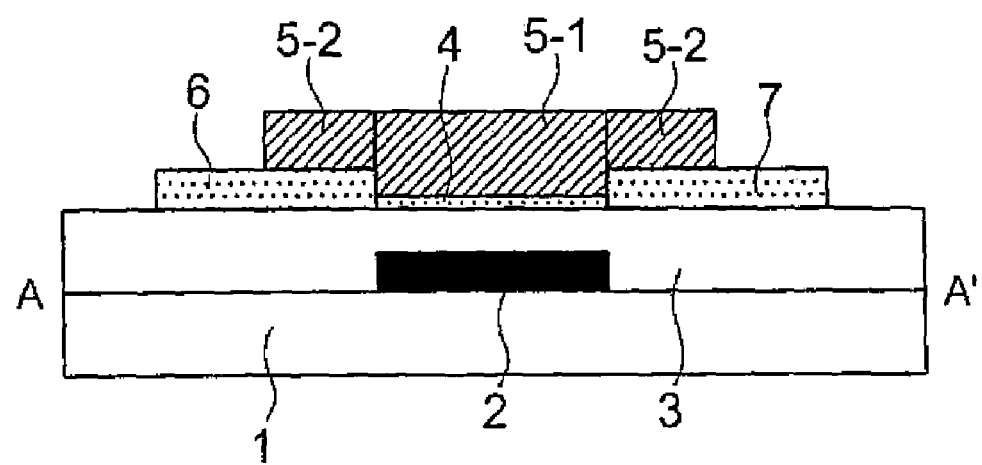

FIG. 9 is a plan view and a sectional view of the thin film transistor which is the second embodiment of the present invention. In this embodiment, drain/source electrodes 6 and 7 are formed by applying and burning an electroconductive ink made of a liquid material containing at least one of metallic microparticles, a metallic complex or an electroconductive polymer, with the use of a so-called bottom contact structure of forming an organic semiconductor film 5 after forming the drain/source electrodes 6 and 7. For the electroconductivity ink is required such a property that the ink applied outside a gate electrode-projected region, while being repelled by the liquid repellency of a SAM 4, does not infiltrate into the gate electrode-projected region, and the ink has only to be a liquid material showing adequately low resistance value after being baked. Particular examples of these materials employed include a solution in which metallic ultra-fine particles with diameters of 10 nm or less mainly consisting of Au, Ag, Pd, Pt, Cu, Ni or the like, or metallic complexes are dispersed in a solvent such as water, toluene and xylene. In order to form a transparent electrode material made of ITO (indium tin oxide), a solution in which a metal alkoxide such as $In(O-i-C_3H_7)_3$ and $Sn(O-i-C_3H_7)_3$ is dispersed in a solvent of water or alcohol, can be employed. Other materials to be employed for forming a transparent electrode in addition to the above include an aqueous solution of PEDOT (poly-3,4-ethylenedioxy thiophene) doped with PSS (polystyrene sulfonate) of an electroconductive polymer, polyaniline (PAn), polypyrrole (PPy) or the like. Any of these materials can form the drain/source electrodes 6 and 7 with a film thickness of about 100 nm as shown in the figure, when applied in the vicinity of the gate electrode-projected region coated with the SAM 4 on the surface of the insulation film 3, and then burnt in vacuum or in the air at a suitable temperature of about 80 to 500° C. Manufacturing methods other than the above are the same as those in the embodiment 1, and the description is omitted. In the present embodiment, the SAM 4 selectively disposed in the gate electrode-projected region of the surface of the insulation film 3 shows not only an effect of selectively improving an orientation order of an organic semiconductor film 5-1 formed only on the same region, and improving a switching performance in a dark state without increasing a light leakage current, but also an effect of the drain/source electrodes 6 and 7 disposed self-aligned with the gate electrode. It means that the drain/source electrodes of which the ends align with the gate electrode are formed, because the electroconductive ink does not infiltrate into the gate electrode-projected region due to the liquid repellency of the SAM 4. A space or a channel length between electrodes formed with a coating process when formed not to make a short circuit between both electrodes is generally as long as about 30 μm, because the accuracy for a pattern and a position is low, and a satisfactory current is not obtained. In contrast to this, in the present embodiment, the channel length is determined by a width of the SAM 4 disposed in the gate electrode-projected region, namely the width of the gate electrode 2. Accordingly, the drain/source electrodes 6 and 7 having the width of the gate electrode namely the channel length of about 3 μm, can be formed with a coating process, if the gate electrode is formed with photolithography having a high positional accuracy.

The drain/source electrodes 6 and 7 formed with a process of coating a liquid material, also has a tendency that the corners of the electrodes formed to have a rectangle shape become round as shown in the figure. In this case, a higher electric field than the case in which electrodes face each other at 90 degrees as usual, is applied to the portion 5-2 of an organic semiconductor film, because both ends of the electrodes face each other at an angle formed by tangent lines of 90 degree or less in both corners of the matching sections of gate electrodes and both electrodes. Then a light leakage current due to an irradiation with light onto the portion 5-2 of the organic semiconductor film further increases, but the increase in the light leakage current was inhibited as a result of not improving the orientation order of the portion 5-2 of the organic semiconductor film by not disposing a SAM 4 outside the gate electrode-projected region, as in the present embodiment.

Embodiment 3

Figure 10:
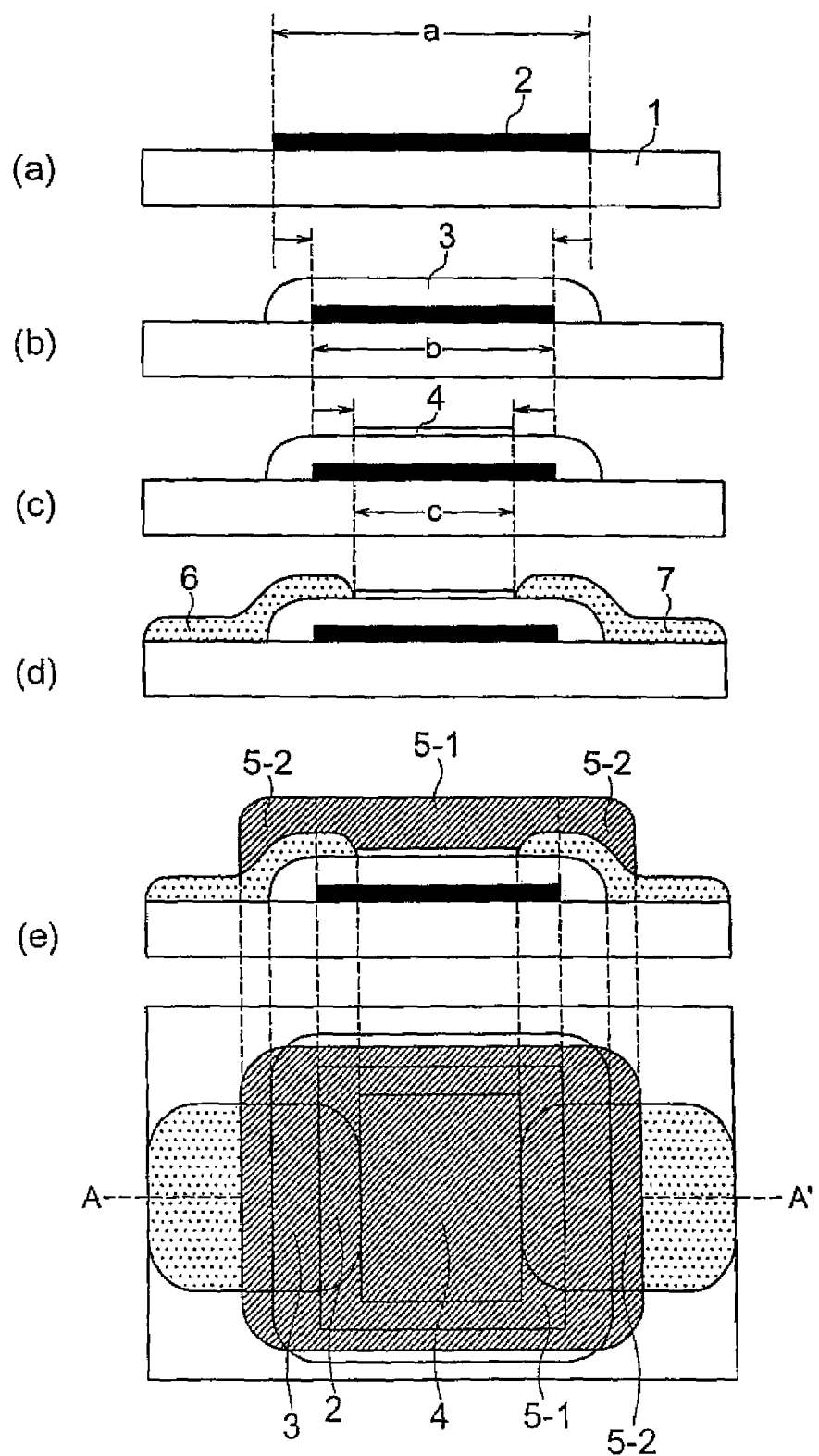
FIG. 10 is a plan view and a sectional view of a thin film transistor, which show an embodiment 3 of the present invention.

FIG. 10 is a plan view and a sectional view of the thin film transistor which is the third embodiment of the present invention. The present embodiment shows an example of forming an insulation film 3 in the thin film transistor of the embodiment 2, by anodically oxidizing a gate electrode. The gate electrode 2 is formed by forming a metallic thin film with a thickness of 200 nm made of Ta or Al on a glass substrate 1 with DC magnetron sputtering, and then processing it with photolithography. The insulator film 3 made of an oxide film with a thickness of 400 nm is formed with anodic oxidation in which DC voltage is applied. On the insulation film 3, drain/source electrodes 6 and 7 are formed self-aligned with the gate electrode 2 by forming selectively a SAM 4 in a gate electrode-projected region with the method described in the embodiment 1, and by employing a process of coating the material similar to the embodiment 2. Finally an organic semiconductor film 5 is formed in a similar way to the embodiment 1, to complete the thin film transistor.

The configuration of the present embodiment provides a thin film transistor having a fine channel length exceeding the limit of a processing accuracy in photolithography. A process for forming the width of a gate electrode 2 ((a) in the figure) into 5 μm which is a lower limit of a processing accuracy, will be now shown. At first, the width of the gate electrode 2 ((b) in the figure) after anodic oxidation becomes about 4 μm by being decreased by about 1 μm, because the surface portion of the gate electrode 2 is oxidized into an oxide film. When a SAM 4 formed thereon is processed with back side exposure, the width of the SAM 4 ((c) in the figure) further decreases compared to that of the gate electrode 2 after anodic oxidation ((b) in the figure). This occurs because the light enters the inner side of the shading region of the gate electrode 2 during back side exposure, due to a diffraction effect of the light passing through an anodic oxide film which is coated on the gate electrode 2 and has a comparatively high refractive index ($Al_2O_3$: $\epsilon$=1.6, $Ta_2O_5$: $\epsilon$=2.4 to 2.6), in addition to the diffraction effect of the light in the edges of the gate electrode 2, and forms the width of a photoresist or the SAM 4 itself into the width of the gate electrode 2 ((b) in the figure) after being anodically oxidized or narrower. In fact, the width (c) of the SAM 4 became about 3 μm. The channel length became about 3 μm, which is determined by a space between both electrodes, because the drain/source electrodes 6 and 7 are self-aligned at both ends of the SAM 4, and thus a value higher than the processing limit of photolithography can be achieved.

Figure 11:
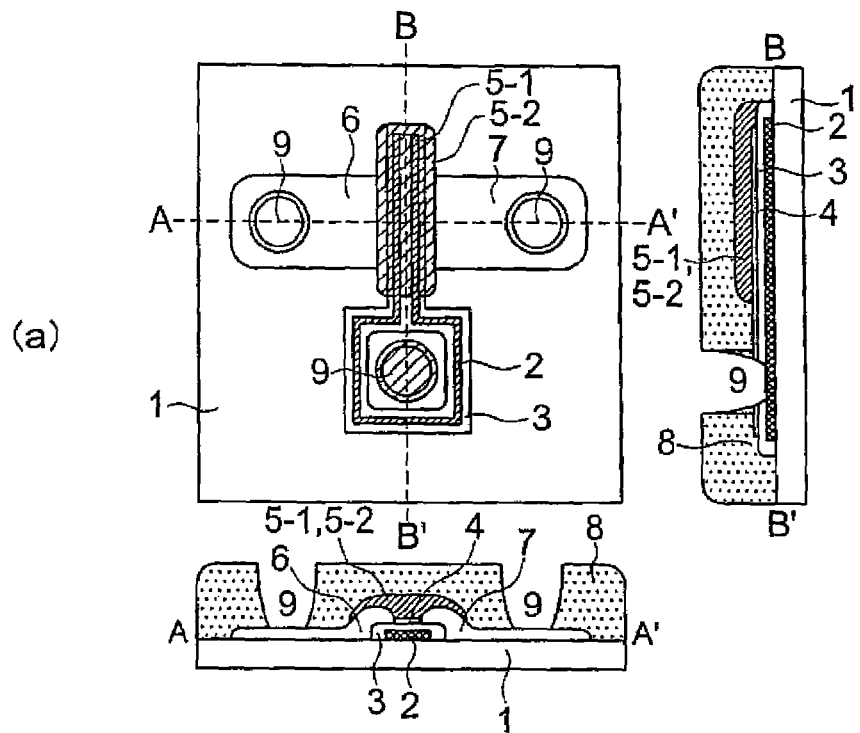
FIG. 11 is a plan view and a sectional view of a thin film transistor, comparing the embodiment 3 of the present invention with a conventional thin film transistor.
Figure 11:
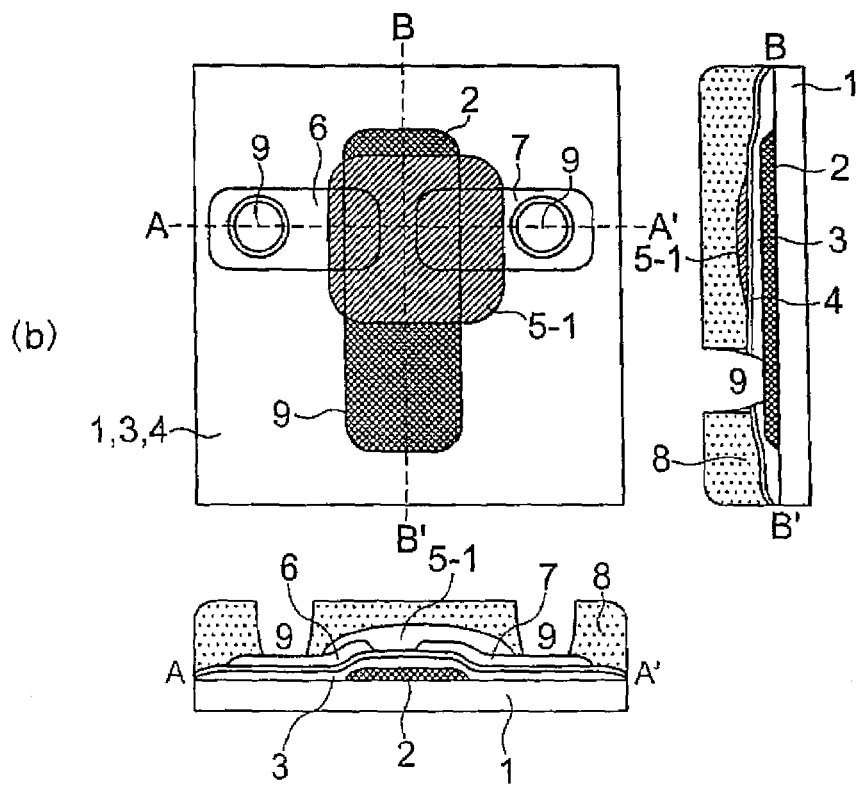
Figure 12:
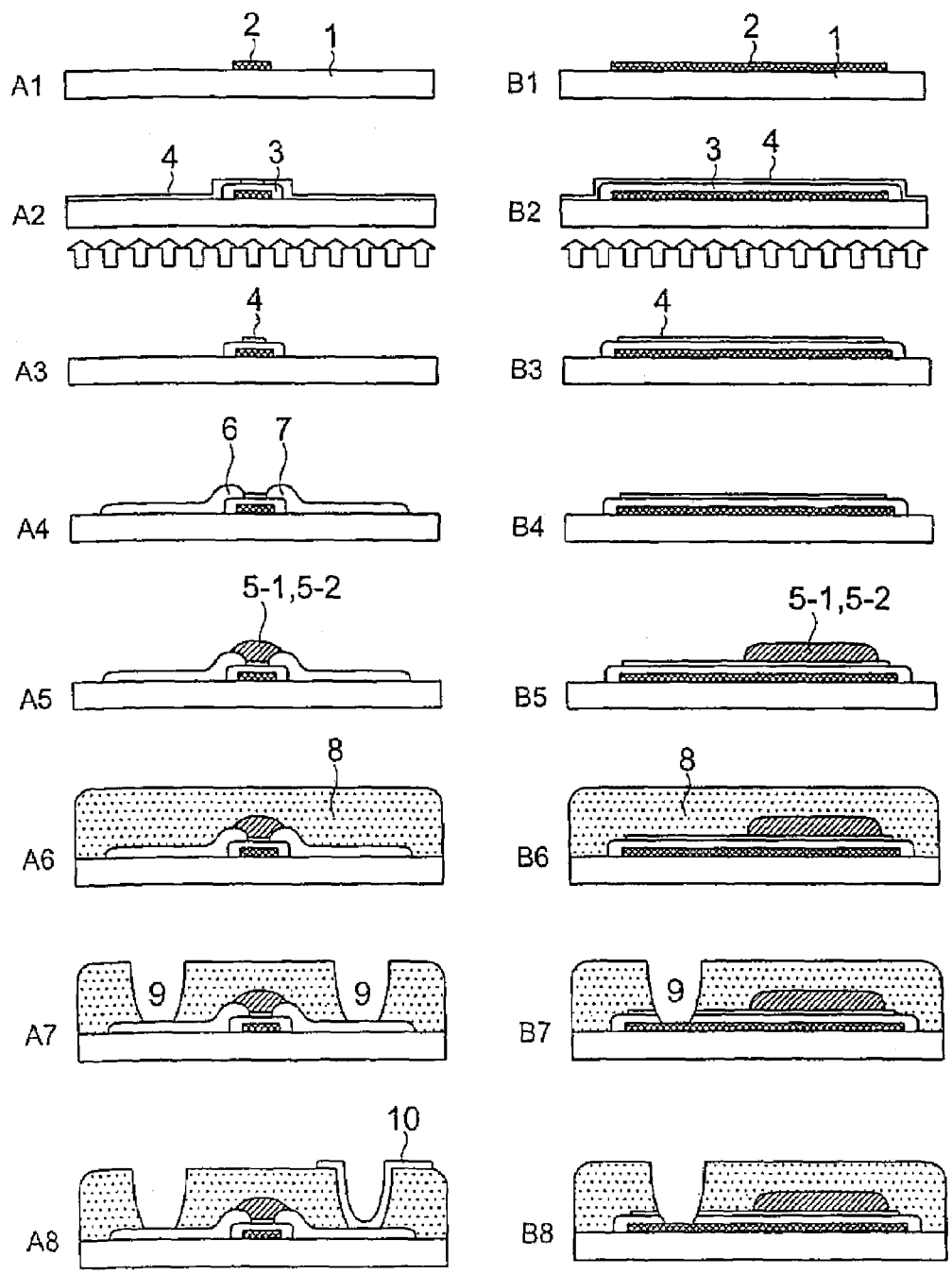
FIG. 12 is a sectional view showing a process for manufacturing the thin film transistor in the embodiment 3 of the present invention.

FIG. 11 is a plan view of the thin film transistor in the present embodiment and in the prior art, and a sectional view taken along straight lines A-A' and B-B', in a process of forming drain/source electrodes with a coating process. In the figure, a protection film 8 is formed on an organic semiconductor film 5, through holes 9 are opened to expose each electrode, and pixel electrodes 10 are connected to source electrodes 7 via the through holes. As the protection film 8, a film of silicon oxide or silicon oxynitride with a thickness of 500 nm has been formed with DC sputtering at room temperature. Then, the through holes 9 are opened with photolithography. As the pixel electrodes 10, a film of ITO with a thickness of 100 nm was formed with DC magnetron sputtering at room temperature, and was processed with photolithography. In the present embodiment (FIG. 11(a)), the thin film transistor has a finer channel length than the limit of a processing accuracy in photolithography, due to the above described effect, has a SAM 4 selectively disposed in a gate electrode-projected region on an insulation film 3 made of an anodic oxide film, has an organic semiconductor film 5 formed thereon, and has the orientation order of organic semiconductor molecules improved selectively only in the particular portion 5-1 of an organic semiconductor film in the gate electrode-projected region. Due to the effects of a shortened channel length and a selectively improved orientation order of the organic semiconductor film, the organic thin film transistor having a high switching performance by increasing an on-state current without increasing a light leakage current has been obtained. In contrast to this, in the prior art (FIG. 11(*b*)) of disposing the insulator film 3 and the SAM 4 on the whole surface of a substrate 1, the on-state current cannot be satisfactorily enhanced, because the space between the drain/source electrodes 6 and 7 (the channel length) determined only by the accuracy of the coating process is as long as about 30 μm. In addition, the thin film transistor cannot cope with a tendency of high definition and high refinement, because the width of the gate electrode 2 has to be set long beforehand while anticipating the deviation of a location, and the gate electrode 2 occupies a large area in the thin film transistor. In addition, it is needless to say that the thin film transistor has an increased light leakage current, because the orientation order in the portion 5-2 of the organic semiconductor film formed outside the gate electrode-projected region is improved. From the above, the present embodiment obviously shows an effect of improving the switching performance of the thin film transistor. FIG. 12 is a sectional view for showing a process of manufacturing the thin film transistor of the present embodiment. The figure shows an example of processing a SAM 4 with direct back-side exposure (A2 to 3 and B2 to 3). Details on steps (A2 and B2) of forming an insulation film 3 with anodic oxidation, a step (A4) of forming self-aligned drain/source electrodes 6 and 7 with a coating process, and other manufacturing methods are omitted since they have been already described.

Embodiment 4

Figure 13:
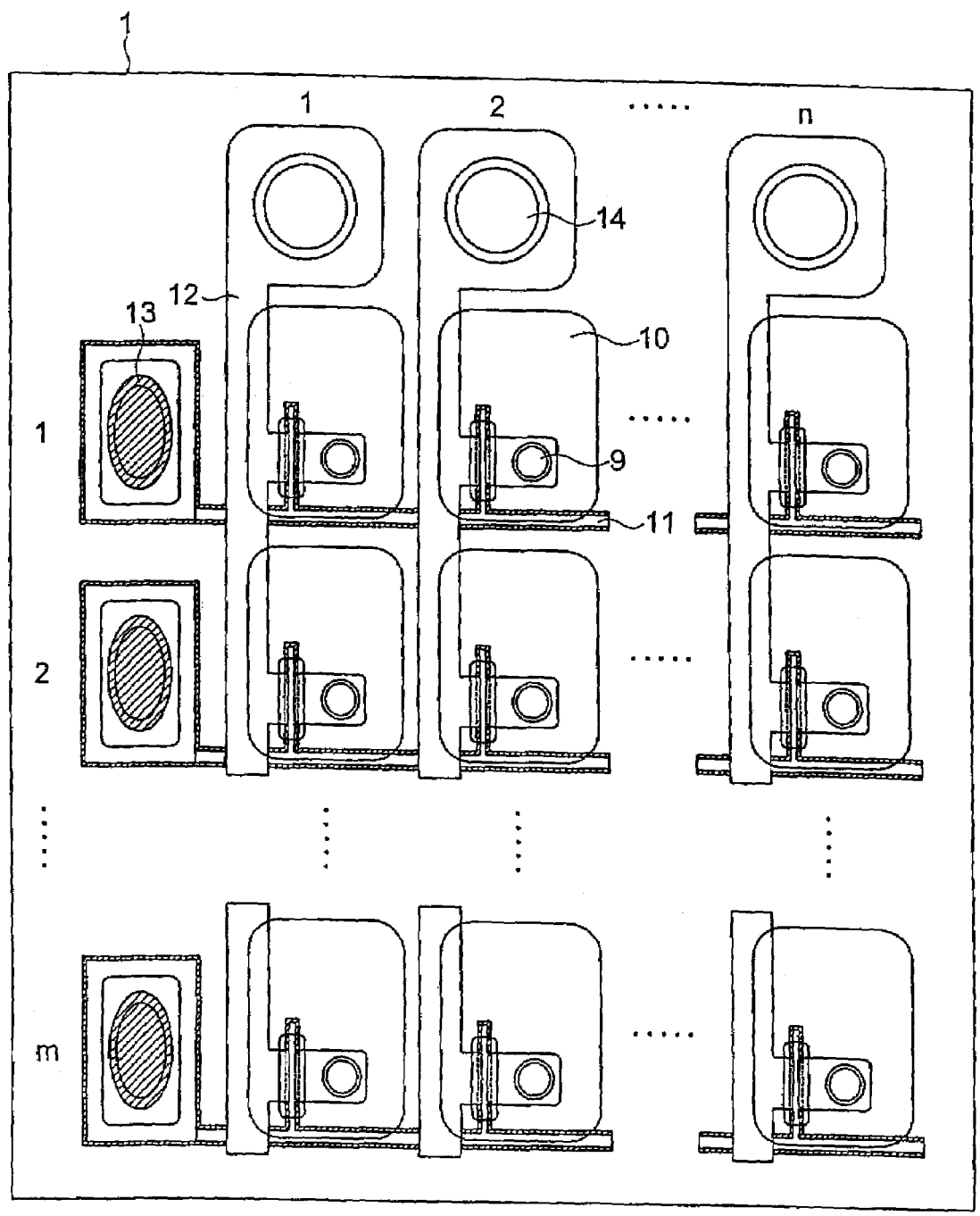
FIG. 13 is a plan view of an active matrix type thin film transistor substrate using the thin film transistor of the present invention.

FIG. 13 is a plan view of an active matrix type thin film transistor substrate which employs the thin film transistor of the present invention for an active device.

In particular, the figure shows an example of applying the thin film transistor in the embodiment 3 in which an insulation film 3 is formed with anodic oxidation. On a substrate 1, m pieces of gate scanning bus lines 11 are arranged in a horizontal direction, n pieces of signal bus lines 12 are arranged in a vertical direction, the thin film transistors of the present invention are disposed at the intersections of the above bus lines arranged in a matrix form, a gate electrode 2 of each thin film transistor is connected to the gate scan electric bus line 11, a drain electrode 6 is connected to the signal bus line 12, and a source electrode 7 is connected to a pixel electrode 10 via a through hole 9 opened in a protection film 8. The gate scanning bus lines 11 are formed simultaneously with the gate electrode 2, and the signal bus lines 12 are formed simultaneously with the drain/source electrodes 6 and 7. The through hole in the protection film 8 is opened not only on a source electrode 7 but also at terminal portions 13 of each gate scanning bus line 11 and a terminal portion 14 of each signal bus line 12. Descriptions on other manufacturing methods are omitted since they are the same as the embodiment 3.

Figure 14:
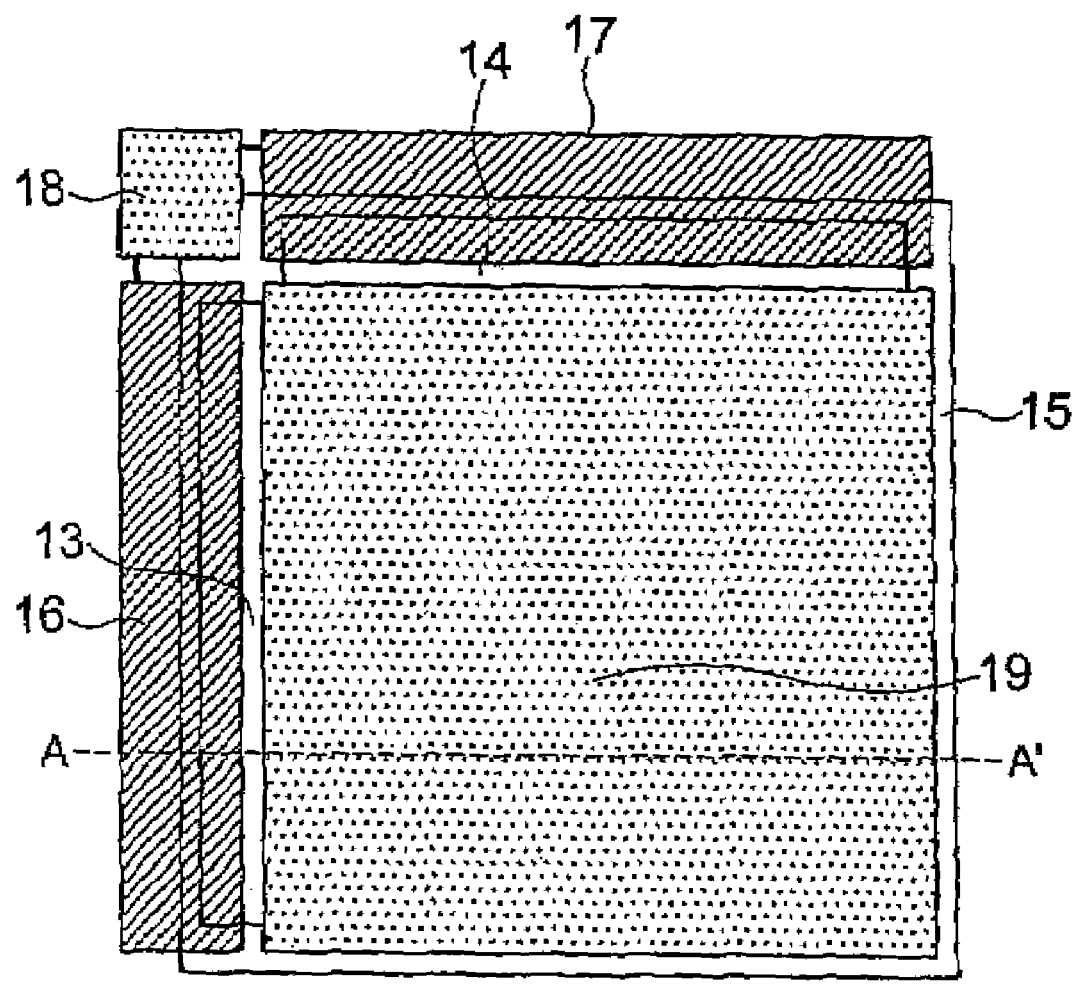
FIG. 14 is a plan view and a sectional view showing a configuration of a liquid crystal display employing an active matrix type thin film transistor substrate with the use of the thin film transistor of the present invention.
Figure 14:
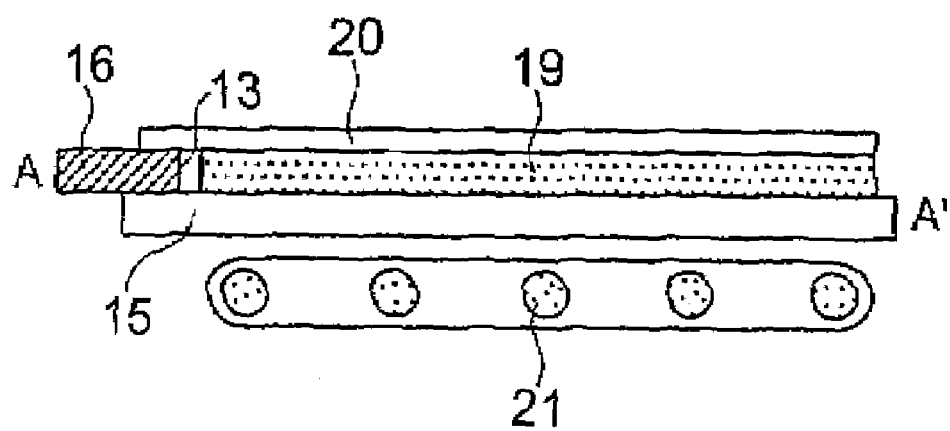

FIG. 14 is a plan view and a sectional view showing a configuration of main components in a liquid crystal display using an active matrix type thin film transistor substrate of the present embodiment. A gate scanning circuit 16 is connected to a terminal portion 13 of a gate scanning bus line of the active matrix type thin film transistor substrate 15, a signal circuit 17 to a terminal portion 14 of a signal bus line with TAB (Tape Automated Bonding) or COG (Chip on Glass), and both circuits are connected to a control circuit 18. Liquid crystal devices 19 in which a twisted nematic (TN) liquid crystal is sandwiched between oriented films, are sandwiched between each pixel electrode of the active matrix type thin film transistor substrate 15 and a counter electrode 20. A backlight 21 made of a cold cathode tube and a transparent body is disposed on the back of the active matrix type thin film transistor substrate 15. The liquid crystal display of the present embodiment works as follows: the thin film transistor operates connected to the gate bus line/electrode to which a scanning voltage is applied output from a gate scanning circuit 16; a signal voltage supplied from a signal circuit 17 in synchronization with the scanning voltage is applied to a pixel electrode connected to the thin film transistor; the liquid crystal devices are driven line by line sequentially as what is so called; and the light transmittance of the back light in each pixel varies and the display unit operates. The present embodiment shows a configuration of the substrate in a liquid crystal display of a vertical electric field system, but a fundamentally similar configuration can be applied to a liquid crystal display of a horizontal electric field system, though it is different from the figure, because as is generally known, the counter electrode 20 is provided in the thin film transistor substrate. The display unit can be applied to a flat display unit such as a mobile telephone, a flat television and a notebook computer.

The thin film transistor of the present embodiment can drive a liquid crystal display without causing malfunctions due to a bright light from the back light, due to an improved switching performance free from increase in a light leakage current, as described earlier.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method for manufacturing a thin film transistor comprising the steps of:
    forming a gate electrode on a substrate,
    forming an insulation film on the gate electrode,
    forming a self assembled monolayer film within a gate electrode-projected region and on the insulation film,
    forming a semiconductor film on the insulation film and the self assembled monolayer film, the semiconductor film being composed of an aggregate of organic semiconductor molecules, and
    forming a source electrode and drain electrode on the insulation film and the semiconductor film.

2. The method according to claim 1, wherein the self assembled monolayer film is formed in approximately the same pattern shape as the gate electrode.

3. The method according to claim 1, wherein the step of forming the self assembled monolayer film within the gate electrode-projected region includes the sub-steps of:
    forming the self assembled monolayer film on the insulation film,
    applying a photoresist onto the self assembled monolayer film,
    exposing the applied photoresist to light through a photomask that shades a gate electrode-projected region, and removing the photoresist formed in the region outside the gate electrode-projected region, etching and removing the self assembled monolayer film formed in the region outside the gate electrode-projected region using a pattern of the photoresist as a mask, and removing the photoresist.

4. The method according to claim 1, wherein the steps of forming the self assembled monolayer film includes the sub-steps of:

forming the self assembled monolayer film on the insulation film, applying photoresist onto the self assembled monolayer film, exposing the applied photoresist to light from a side of the substrate opposite to a side on which the gate electrode is formed, and removing the photoresist formed in the region outside the gate electrode-projected region, etching and removing the self assembled monolayer film formed in the region outside the gate electrode-projected region using a pattern of the photoresist as a mask, and removing the photoresist.

5. The method according to claim 1, wherein the steps of forming the self assembled monolayer film includes the sub-steps of:

forming the self assembled monolayer film on the insulation film, and exposing the substrate to light from a side of the substrate opposite to a side on which the gate electrode is formed, and removing the self assembled monolayer film formed in the region outside the gate electrode-projected region.

6. The method according to claim 5, wherein the self assembled monolayer film is composed of a photodecomposable material which is decomposed and removed by a light with a wavelength transmitting the substrate and the insulation film.

7. A method for manufacturing a thin film transistor comprising the steps of:

forming a gate electrode on a substrate, forming an insulation film on the gate electrode, forming a self assembled monolayer film within a gate electrode-projected region and on the insulation film, applying and burning an electroconductive ink on the insulation film to form a source electrode and drain electrode, forming a semiconductor film on the source electrode and drain electrode and on the self assembled monolayer film, the semiconductor film being composed of an aggregate of organic semiconductor molecules.

8. The method according to claim 7, wherein the self assembled monolayer film is formed in approximately the same pattern shape as the gate electrode.

9. The method according to claim 7, wherein the step of forming the self assembled monolayer film within the gate electrode-projected region includes the sub-step of:

forming the self assembled monolayer film on the insulation film, applying a photoresist onto the self assembled monolayer film, exposing the applied photoresist to light through a photomask that shades a gate electrode-projected region, and removing the photoresist formed in the region outside the gate electrode-projected region, etching and removing the self assembled monolayer film formed in the region outside the gate electrode-projected region using a pattern of the photoresist as a mask, and removing the photoresist.

10. The method according to claim 7, wherein the step of forming the self assembled monolayer film within the gate electrode-projected region includes the sub-steps of:

forming the self assembled monolayer film on the insulation film, applying the photoresist onto the self assembled monolayer film, exposing the applied photoresist to light from a side of the substrate opposite to a side on which the gate electrode is formed, and removing the photoresist formed in the region outside the gate electrode-projected region, etching and removing the self assembled monolayer film formed in the region outside the gate electrode-projected region using a pattern of the photoresist as a mask, and removing the photoresist.

11. The method according to claim 7, wherein the step of forming the self assembled monolayer film within the gate electrode-projected region includes the sub-steps of:

forming the self assembled monolayer film on the insulation film, exposing the substrate to light from a side of the substrate opposite to a side on which the gate electrode is formed, and removing the self assembled monolayer film formed in the region outside the gate electrode-projected region.

12. The method according to claim 11, wherein the self assembled monolayer film is composed of a photodecomposable material which is decomposed and removed by a light with a wavelength transmitting the substrate and the insulation film.

* * * * *